US010224227B2

(12) United States Patent
Ohashi et al.

(10) Patent No.: US 10,224,227 B2
(45) Date of Patent: Mar. 5, 2019

(54) METHOD OF PROCESSING SUBSTRATE

(71) Applicant: HITACHI KOKUSAI ELECTRIC INC., Tokyo (JP)

(72) Inventors: Naofumi Ohashi, Toyama (JP); Satoshi Takano, Toyama (JP); Kazuyuki Toyoda, Toyama (JP); Shun Matsui, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/917,131

(22) Filed: Mar. 9, 2018

(65) Prior Publication Data

US 2018/0286727 A1 Oct. 4, 2018

(30) Foreign Application Priority Data

Mar. 30, 2017 (JP) .................. 2017-067757

(51) Int. Cl.
*H01L 21/677* (2006.01)
*H01L 21/683* (2006.01)
*F17D 1/04* (2006.01)
*H01L 21/67* (2006.01)
*H01J 37/32* (2006.01)
*H01L 21/687* (2006.01)

(52) U.S. Cl.
CPC ........ *H01L 21/67739* (2013.01); *F17D 1/04* (2013.01); *H01J 37/32449* (2013.01); *H01L 21/67017* (2013.01); *H01L 21/6719* (2013.01); *H01L 21/67103* (2013.01); *H01L 21/67173* (2013.01); *H01L 21/67248* (2013.01); *H01L 21/6838* (2013.01); *H01L 21/68742* (2013.01); *H01L 21/68792* (2013.01)

(58) Field of Classification Search
CPC ......... H01L 21/67739; H01L 21/67103; H01L 21/68792; H01L 21/68742; H01L 21/67248; H01L 21/6719; H01L 21/67173; H01L 21/6838; H01L 21/67017; H01J 37/32449; F17D 1/04
See application file for complete search history.

(56) References Cited

U.S. PATENT DOCUMENTS 9,330,939 B2 * 5/2016 Zope ................... H01L 21/4846
2004/0058293 A1 * 3/2004 Nguyen ............ C23C 16/45525
432/129
2016/0079101 A1 3/2016 Yanai et al.

FOREIGN PATENT DOCUMENTS

JP 2013-235885 A 11/2013
JP 2016-063033 A 4/2016

* cited by examiner

*Primary Examiner* — Karen Kusumakar
(74) *Attorney, Agent, or Firm* — Volpe and Koenig, P.C.

(57) ABSTRACT

Described herein is a technique capable of improving the uniformity of device characteristics. According to the technique described herein, there is provided a method of processing a substrate, including: (a) loading a substrate having a patterned hard mask into a process chamber; (b) supplying a metal-containing gas at a first pressure into the process chamber; and (c) supplying an inert gas into the process chamber and storing the metal-containing gas at a second pressure lower than the first pressure after performing (b).

19 Claims, 8 Drawing Sheets

METHOD OF PROCESSING SUBSTRATE

CROSS-REFERENCE TO RELATED PATENT APPLICATION

This non-provisional U.S. patent application claims priority under 35 U.S.C. § 119 of Japanese Patent Application No. 2017-067757, filed on Mar. 30, 2017, the entire contents of which are hereby incorporated by reference.

BACKGROUND

1. Field

The present disclosure relates to a method of processing a substrate.

2. Description of the Related Art

An exemplary substrate processing apparatus for processing a substrate includes a process chamber wherein the substrate is processed, and the substrate is processed by a method of processing a substrate using the substrate processing apparatus.

The substrate processing apparatus is capable of processing various types of substrates. One of the various types of substrates is a glass substrate used as a lithography template for nanoimprint. The lithography template is transcribed onto a resin on a substrate to form a pattern on the substrate.

Recently, as semiconductor devices are integrated in high density, miniaturization of pattern formed in a semiconductor device is required. In order to miniaturize patterns, research is being conducted on a method of forming microstructure such as pillars and hard mask used for forming pillars. In the process of forming micro-patterns, processes such as etching are performed. It is also required to improve the durability of the pattern such that the pattern is not damaged by processes such as etching. When the pattern is partially damaged, the uniformity of device characteristics can not be maintained on the surface of the substrate.

SUMMARY

Described herein is a technique capable of improving the uniformity of device characteristics.

According to one aspect of the technique described herein, there is provided a method of processing a substrate, including: (a) loading a substrate having a patterned hard mask into a process chamber; (b) supplying a metal-containing gas at a first pressure into the process chamber; and (c) supplying an inert gas into the process chamber and storing the metal-containing gas at a second pressure lower than the first pressure after performing (b).

DETAILED DESCRIPTION

Figure 1A:
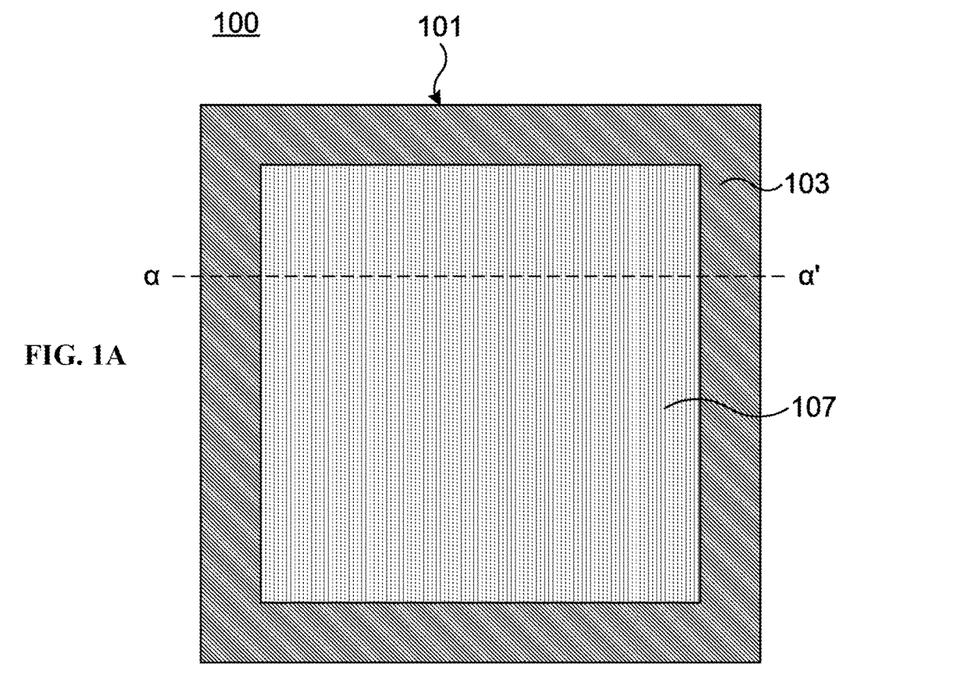
FIG. 1A is a top view of a substrate 100.
Figure 1B:
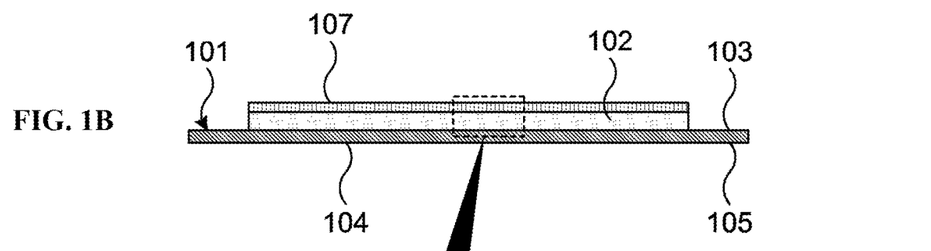
FIG. 1B is a cross-sectional view taken along the line α-α' of FIG. 1A.
Figure 1C:
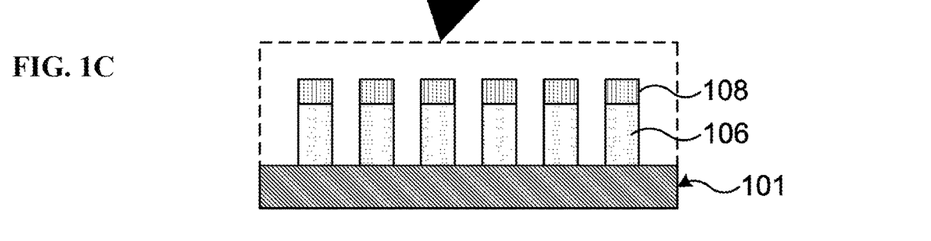
FIG. 1C is an enlarged view of a portion of a pattern region of the substrate 100 after a patterning process.

Hereinafter, an embodiment will be described with reference to the FIGS. 1A through 8. First, a substrate 100 to be processed will be described with reference to FIGS. 1A through 1C. The substrate 100 shown in FIGS. 1A through 1C is used as a lithography template for nanoimprint. FIGS. 1A through 1C illustrate the substrate 100 with a pattern region 102, which will be described later in detail.

FIG. 1A is a top view of the substrate 100, and FIG. 1B is a cross-sectional view taken along the line α-α' of FIG. 1A. As described above, the substrate 100 is used as the lithography template for nanoimprint. Hereinafter, the lithography template for nanoimprint is also referred to as "L-template." FIG. 1C is an enlarged view of a portion of the pattern region 102 after a patterning process wherein a pattern 108 is formed from a hard mask film 107.

A pre-formed template called the master template (not shown) is used to form the L-template. The L-template is used as a template for transcribing a pattern onto a substrate. By pressing the L-template onto the substrate, the pattern is transferred onto the substrate.

The substrate (L-template) 100 includes a glass substrate 101 as a base and the pattern region 102 formed on the glass substrate 101. The pattern region 102 is convex such that the substrate (L-template) 100 does not come in contact with a portion other than the portion of the substrate onto which the pattern is transcribed when the substrate (L-template) 100 is pressed against the substrate.

The pattern 108, which is also referred to as "hard mask pattern 108", is formed by patterning the hard mask film 107. A pillar 106 is formed by etching the pattern region 102 using the hard mask pattern 108 as a mask. The pillar 106 is made of silicon (Si), for example.

A region 103 is a region of the front surface of the glass substrate 101 other than the pattern region 102. Because the region 103 does not come in contact with the substrate onto which the pattern is transcribed, the region 103 is also referred to as "non-contacting region 103" in the embodiment. A back surface 104 is the back surface of the pattern region 102, and a back surface 105 is the back surface of the non-contacting region 103. In the embodiment, the back surface 104 is also referred to as the "center back surface 104" of the substrate 100 and the back surface 105 is also referred to as the "periphery back surface 105" of the substrate 100.

In the embodiment, a method of processing the hard mask pattern 108 will be described.

<Configuration of Substrate Processing Apparatus>

Hereinafter, an exemplary substrate processing apparatus capable of processing the substrate (L-template) 100 will be described.

Figure 2:
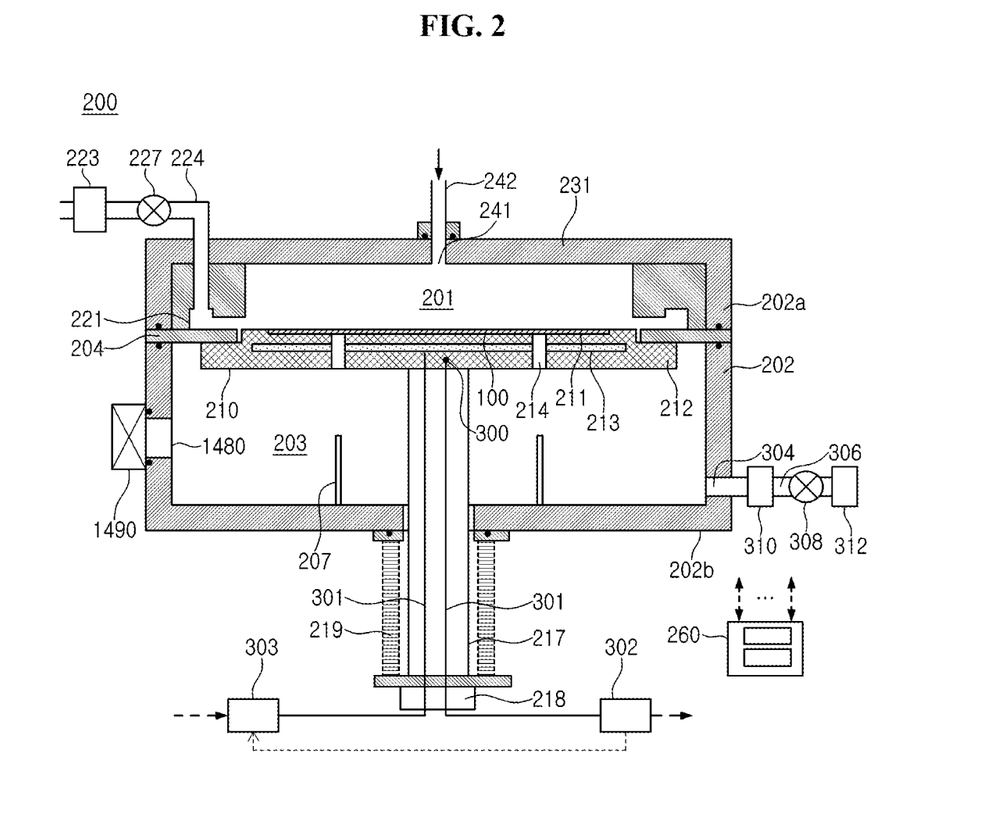
FIG. 2 schematically illustrates a vertical cross-section of a substrate processing apparatus according to an embodiment described herein.

A substrate processing apparatus 200 according to the embodiment will be described. The substrate processing apparatus 200 includes, for example, a single wafer type substrate processing apparatus. A substrate processing is performed using the substrate processing apparatus 200.

As shown in FIG. 2, the substrate processing apparatus 200 includes a process vessel 202. The process vessel 202 is a flat and sealed vessel having a circular horizontal cross-section. The process vessel 202 is made of a material such as quartz and a metal material such as aluminum (Al) and stainless steel (SUS). A process chamber 201 where the substrate 100 such as a silicon substrate is processed and a transfer chamber 203 are provided in the process vessel 202. The process vessel 202 includes an upper vessel 202a and a lower vessel 202b. A partition plate 204 is provided between the upper vessel 202a and the lower vessel 202b. The space defined by the upper vessel 202a and the partition plate 204 is referred to as the process chamber 201 or a processing space. The space defined by the partition plate 204 and the lower vessel 202b is referred to as the transfer chamber 203 or a transfer space.

A substrate loading/unloading port 1480 is provided in a side wall of the lower vessel 202b adjacent to a gate valve 1490. The substrate 100 is moved between an external transfer chamber (not shown) and the transfer chamber 203 through the substrate loading/unloading port 1480. Lift pins 207 are provided at the bottom of the lower vessel 202b.

A substrate support 210 is provided in the process chamber 201 to support the substrate 100. The substrate support 210 includes a substrate support member 212 having a substrate placing surface 211 on which the substrate 100 is placed. Preferably, the substrate support member 212 may further include a heater 213 serving as a heating mechanism. By heating the substrate 100 with the heater 213, the quality of a film formed on the substrate 100 may be improved. Through-holes 214 penetrated by the lift pins 207 are provided in the substrate support member 212 at positions corresponding to the lift pins 207.

A heater controller 303 is electrically connected to the heater via a wiring 301. A temperature detector 300 for detecting the temperature of the substrate 100 is provided in the substrate support member 212. The temperature detector 300 is electrically connected to, via the wiring 301, a temperature information receiver 302 which receives the temperature detected by the temperature detector 300. The temperature detector 300 transmits the received temperature to a controller 260, which will be described later. The controller 260 generates control values based on, for example, the temperature received from the temperature information receiver 302 and information such as film thickness received from a host apparatus (not shown). The controller 260 transmits the control values to the heater temperature controller 303. The heater temperature controller 303 controls the heater 213 based on the control values transmitted from the controller 260. The temperature detector 300, the wiring 301 and the temperature information receiver 302 may be collectively referred to as "temperature detecting mechanism"

The substrate support member 212 is supported by a shaft 217. The shaft 217 penetrates the bottom of the process vessel 202 and is connected to an elevating mechanism 218 at the outside of the process vessel 202. The substrate 100 placed on the substrate placing surface 211 is elevated and lowered by operating the elevating mechanism 218 by elevating and lowering the shaft 217 and the substrate support member 212. A bellows 219 covers the lower end portion of the shaft 217 to maintain the inside of the process chamber 201 airtight.

When the substrate 100 is transported, the substrate support member 212 is lowered until the substrate placing surface 211 of the substrate support member 212 is at a height of the substrate loading/unloading port 1480 (hereinafter referred to as "substrate transfer position"). When the substrate 100 is processed, the substrate support member 212 is elevated until the substrate 100 reaches a processing position in the process chamber 201 (hereinafter referred to as "substrate processing position").

Specifically, when the substrate support member 212 is lowered to the substrate transfer position, the upper ends of the lift pins 207 protrude from the upper surface of the substrate placing surface 211, and the lift pins 207 supports the substrate 100 from thereunder. When the substrate support member 212 is elevated to the substrate processing position, the lift pins 207 are retracted from the upper surface of the substrate placing surface 211 and the substrate placing surface 211 supports the substrate 100 from thereunder.

<Exhaust System>

An exhaust port 221, which is a part of a first exhaust mechanism for exhausting an inner atmosphere of the process chamber 201, is connected to the surface of the inner wall of the process chamber 201 (the upper vessel 202a). An exhaust pipe 224, which is a first exhaust pipe, is connected to the exhaust port 221. A pressure controller 227 such as an APC (Automatic Pressure Controller) that controls the inner pressure of the process chamber 201 and a vacuum pump 223 are connected in-line to the exhaust pipe 224 in order. The first exhaust mechanism (exhaust line) may include the exhaust port 221, the exhaust pipe 224 and the pressure controller 227. The first exhaust mechanism may further include the vacuum pump 223.

A transfer chamber exhaust port 304, which is a part of a second exhaust mechanism for exhausting an inner atmosphere of the transfer chamber 203, is connected to a lower portion of the side wall of the transfer chamber 203. An exhaust pipe 306, which is a second exhaust pipe, is connected to the transfer chamber exhaust port 304. A valve 308, a pressure controller 310 such as an APC (Automatic Pressure Controller) that controls the inner pressure of the transfer chamber 203 and a vacuum pump 312 are connected in-line to the exhaust pipe 306 in order. The second exhaust mechanism (exhaust line) includes the transfer chamber exhaust port 304, the valve 308, the exhaust pipe 306 and the pressure controller 310. The second exhaust mechanism may further include the vacuum pump 312.

<Gas Introduction Port>

A gas introduction port 241 for supplying various gases into the process chamber 201 is installed at the upper portion (ceiling) of the process chamber 201. A detailed configuration of each gas supply system connected to the gas introduction port 241 will be described later.

<Process Gas Supply System>

Figure 3:
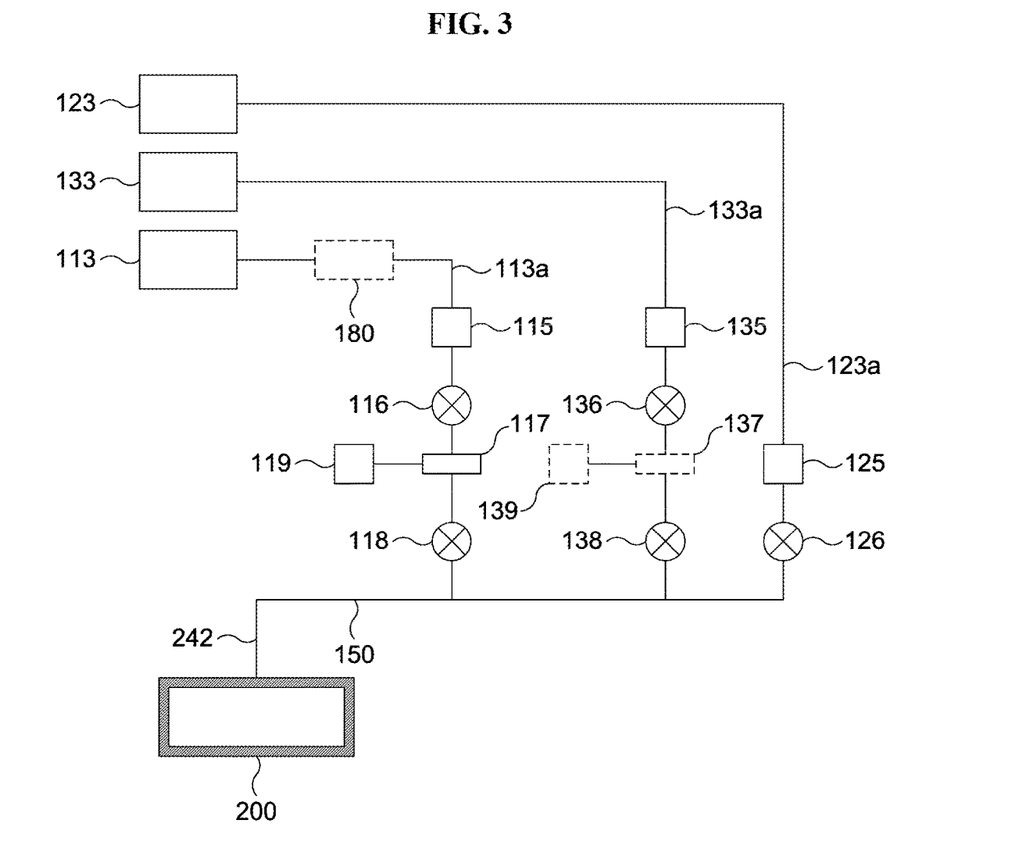
FIG. 3 schematically illustrates a configuration of a gas supply system of the substrate processing apparatus according to the embodiment.

As shown in FIG. 3, a gas supply pipe 150 is connected to the gas introduction port 241 through a common gas supply pipe 242. Various gases are supplied into the substrate processing apparatus 200 through the gas introduction port 241. A first gas, a second gas and an inert gas, which will be described later, are supplied through the gas supply pipe 150.

FIG. 3 schematically illustrates a configuration of gas supply systems such as a first gas supply system, a second gas supply system and an inert gas supply system.

As shown in FIG. 3, a first gas supply pipe 113a, an inert gas supply pipe 133a and a second gas supply pipe 123a are connected to the gas supply pipe 150. The first gas and the second gas are also referred to as a metal-containing gas and an oxygen (O)-containing gas, respectively.

<First Gas Supply System>

The first gas supply system includes the first gas supply pipe 113a, a mass flow controller (MFC) 115, a valve 116, a vaporizer 180, a flash tank 117 and a valve 118. A pressure sensor 119 for monitoring the inner pressure of the flash tank 117 is provided at the flash tank 117. The first gas supply system may further include a first gas source 113 connected to the upstream side of the first gas supply pipe 113a. The first gas supply system may further include the pressure sensor 119.

The first gas is a source gas, i.e. one of process gases. In the embodiment, the first gas may include a metal-containing gas such as an aluminum (Al)-containing gas. For example, the aluminum-containing gas includes trimethyl aluminum (TMA) gas. The source of the first gas may be solid, liquid or gas at room temperature and under atmospheric pressure. In the embodiment, the source of the first gas is in gaseous state.

<Second Gas Supply System>

The second gas supply system includes the second gas supply pipe 123a, a mass flow controller (MFC) 125 and a valve 126. The second gas supply system is also referred to as an oxygen (O)-containing gas supply system. The second gas supply system may further include a second gas source 123 connected to the upstream side of the second gas supply pipe 123a. A remote plasma unit (RPU) (not shown) may be provided at the second gas supply system to activate the second gas. The second gas is a modifying gas, i.e. one of process gases. In the embodiment, the second gas may include an oxygen-containing gas. For example, the oxygen-containing gas includes oxygen ($O_2$) gas.

<Inert Gas Supply System>

The inert gas supply system includes the inert gas supply pipe 133a, a mass flow controller (MFC) 135 and a valve 136. The inert gas supply system may further include an inert gas source 133 connected to the upstream side of the inert gas supply pipe 133a. In the embodiment, the inert gas may include, for example, nitrogen ($N_2$) gas. Instead of $N_2$ gas, rare gases such as helium (He) gas, neon (Ne) gas and argon (Ar) gas may be used as the inert gas.

<Controller>

As shown in FIG. 2, the substrate processing apparatus 200 includes the controller 260 configured to control components thereof.

Figure 4:
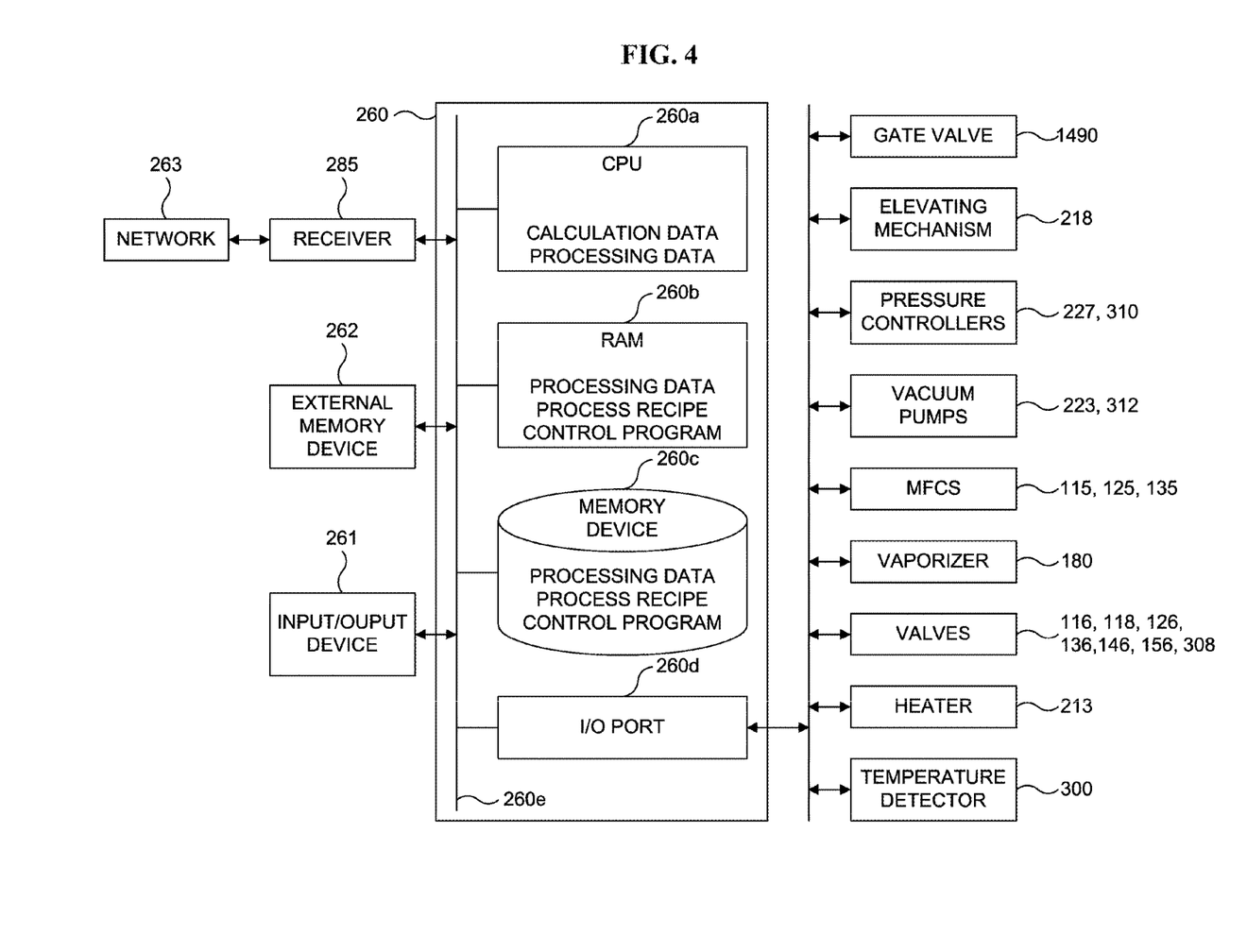
FIG. 4 schematically illustrates a configuration of a controller of the substrate processing apparatus and peripherals thereof according to the embodiment.
Figure 5:
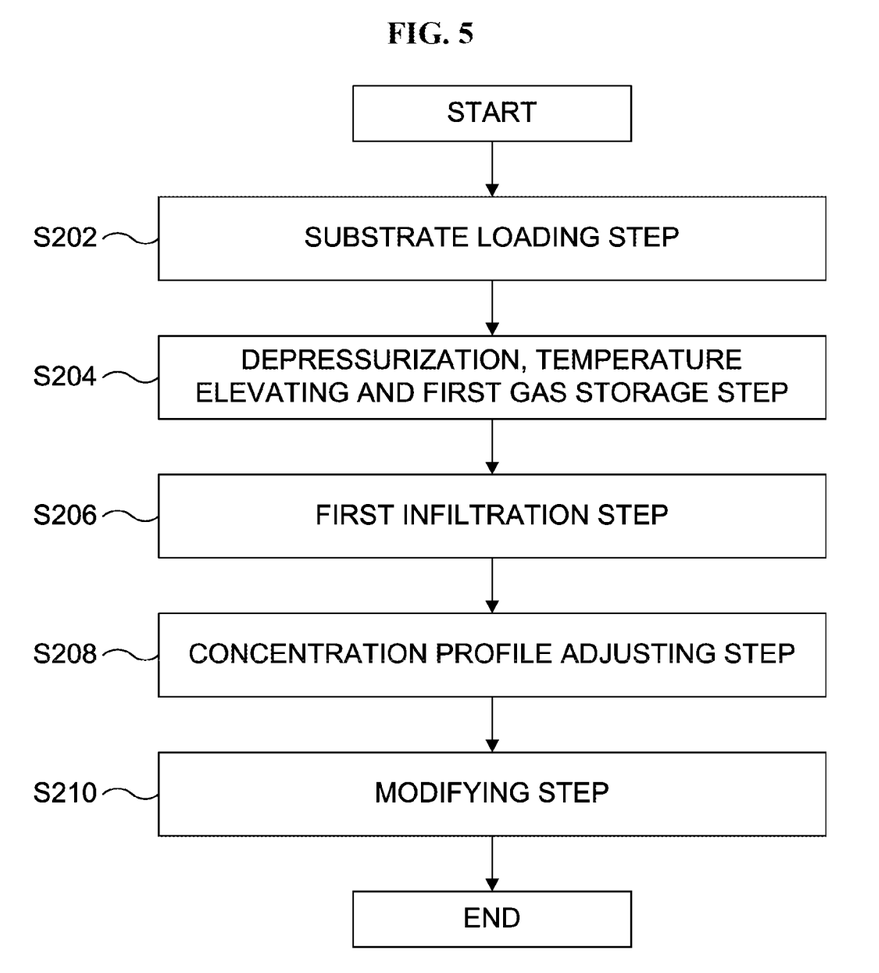
FIG. 5 is a flowchart illustrating a substrate processing according to the embodiment.
Figure 6:
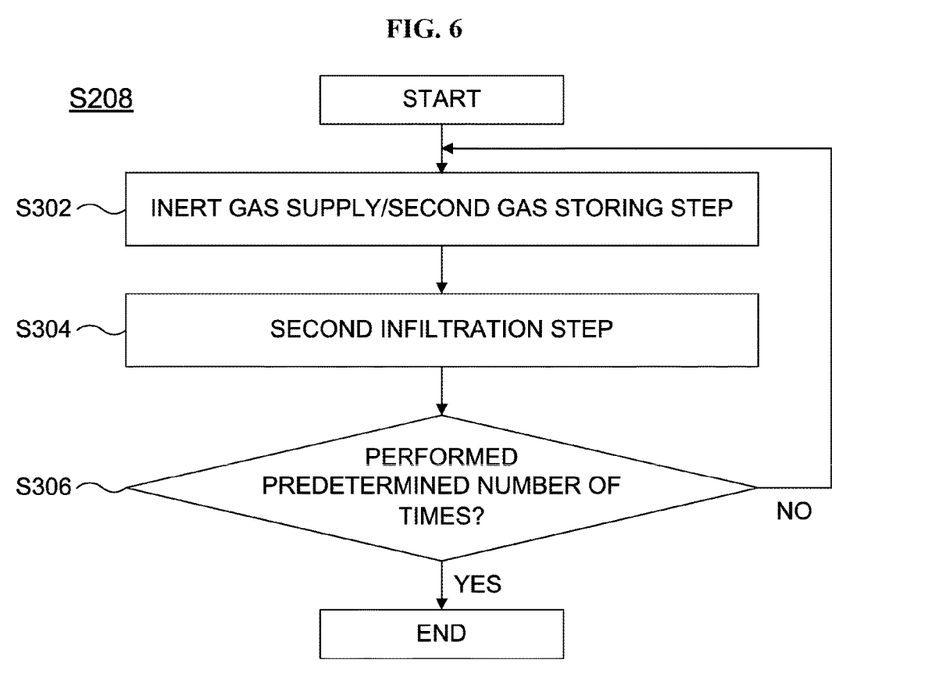
FIG. 6 is a flowchart illustrating a concentration profile adjusting step of the substrate processing according to the embodiment.

FIG. 4 schematically illustrates a configuration of the controller 260. The controller 260, which is a control device (control means), may be embodied by a computer having a CPU (Central Processing Unit) 260a, a RAM (Random Access Memory) 260b, a memory device 260c and an I/O port 260d. The RAM 260b, the memory device 260c and the I/O port 260d may exchange data with the CPU 260a via an internal bus 260e. An input/output device 261 such as a touch panel and an external memory device 262 may be connected to the controller 260.

The memory device 260c may be embodied by components such as flash memory and HDD (Hard Disk Drive). A control program for controlling the operation of the substrate processing apparatus 200; a process recipe in which information such as the order and condition of the substrate processing which will be described later is stored; and calculation data and processing data generated during the processing of the substrate 100 are readably stored in the memory device 260c. The process recipe is a program that is executed in the controller 260 to obtain a predetermined result by performing sequences of the substrate processing. Hereinafter, the process recipe and the control program are collectively referred to simply as a program. The term "program" may refer to only the process recipe, only the control program, or both. The RAM 260b is a work area in which the program or the data such as the calculation data and the processing data read by the CPU 260a are temporarily stored.

The I/O port 260d is electrically connected to the components such as the vaporizer 180, the gate valve 1490, the elevating mechanism 218, the heater 213, the pressure controllers 227 and 310, the vacuum pumps 223 and 312, the valves 116, 126, 136, 146, 156 and 308, and the MFCs 115, 125 and 135.

The CPU 260a serving as an arithmetic unit is configured to read and execute the control program stored in the memory device 260c, and read the process recipe stored in the memory device 260c in accordance with an instruction such as an operation command inputted from the input/output device 261. The CPU 260a may compute the calculation data by comparing a value inputted from the receiver 285 with the process recipe or control data stored in the memory device 260c. The CPU 260a may select the processing data (process recipe) based on the calculation data. The CPU 260a may be configured to control operation of the substrate processing apparatus 200 according to the process recipe. For example, the CPU 260a may be configured to perform operation such as the opening and closing operations of the gate valve 1490, the elevating and lowering operations of the elevating mechanism 218, the power supply operation to the heater 213, the pressure controlling operations of the pressure controllers 227 and 310, the ON/OFF operations of the vacuum pumps 223 and 312, the operations of the temperature detector 300, ON/OFF operations of the valves 116, 118, 126, 136 and 308, and the operations of the MFCs 115, 125 and 135.

The controller 260 may be embodied by a dedicated computer or a general purpose computer. The controller 260 of the embodiment may be embodied by preparing the external memory device 262 (e.g. magnetic tapes, magnetic disks such as flexible disk and hard disk, optical disks such as CD and DVD, magneto-optical disks such as MO, and semiconductor memories such as USB memory and memory card) and installing the program on the general purpose computer using the external memory device 262. The method of providing the program to the computer is not limited to the external memory device 262. The program may be directly provided to the computer using a communication means such as a network 263 (Internet or dedicated line) without the external memory device 262. The memory device 260c or the external memory device 262 may be embodied by a non-transitory computer readable recording medium. Hereafter, the memory device 260c and the external memory device 262 are collectively referred to as recording media. In this specification, "recording media" may indicate only the memory device 260c, indicate only the external memory device 262, and indicate both of the memory device 260c and the external memory device 262.

(2) Substrate Processing Method

Hereinafter, a substrate processing using the substrate processing apparatus 200 will be described. By subjecting the hard mask pattern 108 on the substrate 100 to the substrate processing to cure the hard mask pattern 108, a highly durable L-template is obtained. The substrate processing will be described in detail with reference to FIG. 5.

The substrate processing may be replaced by one of the manufacturing processes of the semiconductor device for the substrate 100.

In the following description, the operations the components constituting the substrate processing apparatus 200 are controlled by the controller 260.

Hereinafter, the substrate processing method will be described.

<Substrate Loading Step S202>

In the substrate processing, as shown in FIG. 1, the substrate 100 having the hard mask pattern 108 formed thereon is loaded into the process chamber 201. Specifically, the substrate support member 212 is lowered by the elevating mechanism 218, the lift pins 207 protrude from the upper surface of the substrate support member 212 through the through-holes 214. After the inner pressure of the process chamber 201 is adjusted to a predetermined pressure, the gate valve 1490 is opened. The substrate 100 is transferred through the gate valve 1490 and placed on the lift pins 207. After the substrate 100 is placed on lift pins 207, the substrate support member 212 is elevated by the elevating mechanism 218 to transfer the substrate 100 to the substrate support member 212.

<Depressurization, Temperature Elevating and First Gas Storing Step S204>

Next, the process chamber 201 is exhausted through the exhaust pipe 224 until the inner pressure of the process chamber 201 reaches a predetermined level (vacuum level). At this time, the opening degree of the APC valve serving as the pressure controller 227 is feedback-controlled based on the pressure measured by a pressure sensor (not shown). The energization state of the heater 213 is feedback-controlled based on the temperature detected by the temperature detector 300 such that the inner temperature of the process chamber 201 reaches a predetermined temperature higher than that of the transfer chamber 203. Specifically, the substrate support member 212 is pre-heated by the heater 213 until the temperature of the substrate 100 or the temperature of the substrate support member 212 is stable. This completes the pre-processing prior to a first infiltration step S206. It is preferable that the process chamber 201 is exhausted to a vacuum level that may be reached by a single exhaust. The inert gas may be supplied by the inert gas supply system while the inner pressure of the process chamber 201 is controlled.

At this time, the temperature of the heater 213 may range from room temperature to 150° C., preferably from room temperature to 90° C., more preferably from 60° C. to 90° C. The temperature of the heater 213 is the temperature at which the first gas is adsorbed onto the substrate 100. That is, the temperature of the heater 213 is at a predetermined level that generates the reaction between the first gas and the substrate 100. Preferably, the temperature of the heater 213 is such that the film formed on the substrate 100 is not degraded. For example, the temperature of the heater 213 is at a predetermined level that prevents both the pyrolysis and the re-liquefaction of the first gas. That is, the temperature of the heater 213 is higher than the temperature at which the first gas is re-liquefied and lower than the temperature at which the first gas is pyrolyzed. When the temperature of the heater 213 is higher than the temperature at which the first gas is re-liquefied and lower than the temperature at which the first gas is pyrolyzed. In this way, the metal component can infiltrate the hard mask pattern 108.

In parallel, the first gas is supplied to flash tank 117 by opening valve 116 with the valve 118 closed. The first gas is stored in the flash tank 117 at a first pressure of a high pressure level. As a result, the first gas may be supplied to the process chamber 201 at high pressure by opening the valve 118.

The inner pressure of the flash tank 117 is at the predetermined level that prevents the re-liquefaction of the first gas. If the inner pressure of the flash tank 117 is at such a level that the first gas is re-liquefied, the metal component of the first gas solidifies, which makes it difficult to supply the metal component to the process chamber 201. The metal component in gaseous state may be smoothly supplied to the process chamber 201 by adjusting the inner pressure of the flash tank 117 to be at such that the first gas is not re-liquefied as in the present embodiment.

<First Infiltration Step S206>

Figure 7:
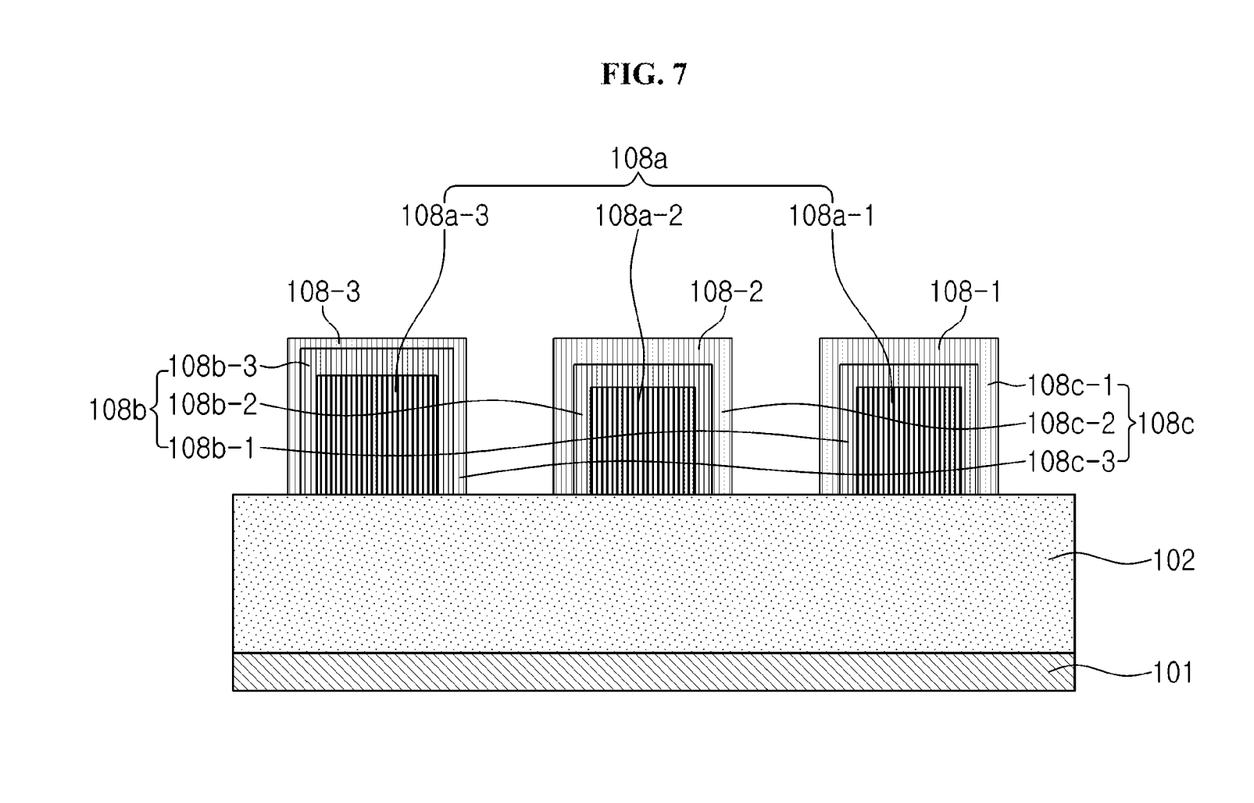
FIG. 7 illustrates a substrate and structures formed thereon during the substrate processing according to the embodiment.

A first infiltration step S206 for infiltrating the metal component into the hard mask pattern 108 will be described with reference to FIG. 7. FIG. 7 illustrates the hard mask pattern 108 into which the metal component have infiltrated in the first infiltration step S206. A center portion 108a and a peripheral portion 108c are the inner portion and the outer portion of the hard mask pattern 108, respectively. An intermediate portion 108b is a portion disposed between the center portion 108a and the peripheral portion 108c. In FIG. 7, the shades of the center portion 108a, the peripheral portion 108c and the intermediate portion 108b indicates the state of the infiltration of the metal component. For example, darker shade indicates a larger infiltration of the metal component.

Hereinafter, the hard mask patterns 108 are referred to as hard mask pattern 108-1, hard mask pattern 108-2 and hard mask pattern 108-3 from right to left. The center portions 108a are referred to as center portion 108a-1, center portion 108a-2 and center portion 108a-3 from right to left. The intermediate portions 108b are referred to as intermediate portion 108b-1, intermediate portion 108b-2 and intermediate portion 108b-3 from right to left. The peripheral portions 108c are referred to as peripheral portion 108c-1, peripheral portion 108c-2 and peripheral portion 108c-3 from right to left.

The concentrations of the metal component in the center portions 108a, i.e., the center portion 108a-1 through the center portion 108a-3, are substantially the same. The concentrations of the metal component in the intermediate portions 108b, i.e., the intermediate portions 108b-1 through the intermediate portion 108b-3, are substantially the same. The concentrations of the metal component in the peripheral portions 108c, i.e., the peripheral portion 108c-1 through the peripheral portion 108c-3, are also substantially the same.

In the first infiltration step S206, the first gas (source gas) is supplied from the flash tank 117 into the process chamber 201 at a high pressure. Herein, supplying gas at high pressure is referred to as "flash supply." Due to the high pressure of the first gas, the metal component of the first gas is able to infiltrate the center portion 108a of the hard mask pattern 108 as shown in FIG. 7.

<Concentration Profile Adjusting Step S208>

Next, a concentration profile adjusting step S208 will be described. As described above, since the inner pressure of the flash tank 117 is at the predetermined level that prevents the re-liquefaction of the first gas, the amount of the first gas supplied at the first infiltration step S206 is limited. Thus, by maintaining the pressure of the first gas at a high level at the beginning of supplying the first gas, the metal component of the first gas is able to infiltrate the center portion 108a. By combining the components of the center portion 108a and the supplied metal component, a film having high physical resistance may be formed.

When a predetermined time has elapsed and the pressure is lowered, the components of the hard mask pattern 108 and the metal component do not have sufficient energy for bonding. Therefore, the degree of bonding between the components of the hard mask pattern 108 and the metal component decreases toward to the peripheral portion of the hard mask pattern 108 while the degree of bonding between the components of the hard mask pattern 108 and the metal component is high in the center portion 108a of the hard mask pattern 108.

Among the center portion 108a, the intermediate portion 108b and the peripheral portion 108c shown in FIG. 7, the degree of bonding is highest in the center portion 108a is lowest in the peripheral portion 108c. Generally, the etch resistance of the center portion 108a, the etch resistance of the intermediate portion 108b, and the etch resistance of the peripheral portion 108c differ from one another since the film hardens in proportion to the degree of bonding. As a result, the peripheral portion 108c is more easily etched than the center portion 108a.

Figure 8:
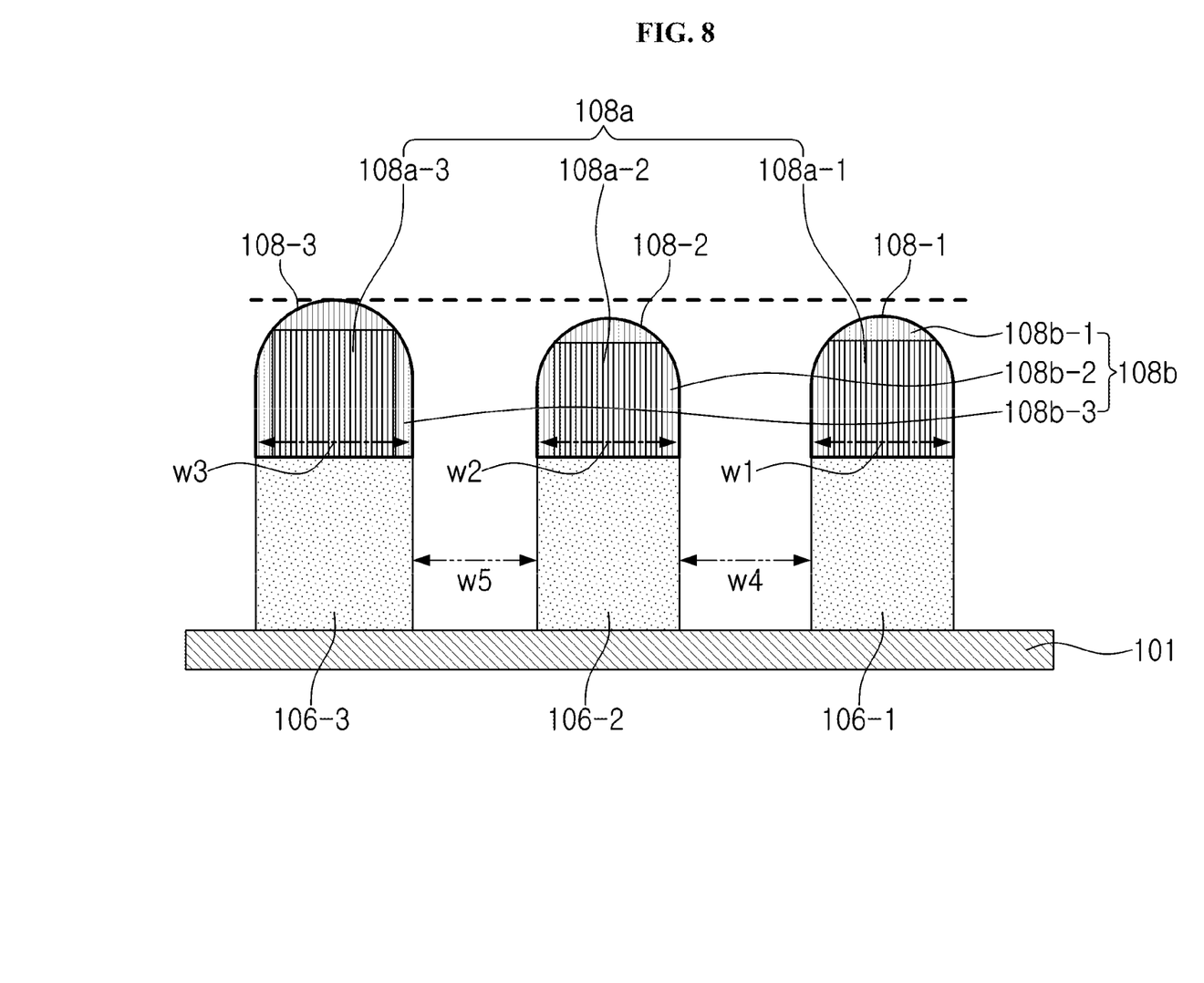
FIG. 8 illustrates a substrate and structures formed thereon during the substrate processing according to the embodiment.

The problem occurring in an etching process for forming the pillar 106 when the peripheral portion 108c is more easily etched than the center portion 108a will be described with reference to FIG. 8. Generally, although the hard mask pattern 108 has etch selectivity with respect to the pattern region 102, the hard mask pattern 108 is also etched in the etching process.

That is, in the etching process for forming the pillar 106, the upper portion of the hard mask pattern 108 is first etched. As the etching process continues, the entire peripheral portion 108c is etched and the intermediate portion 108b is exposed. Since the concentration of the metal component in the intermediate portion 108b is higher than that of the metal component in the peripheral portion 108c, the exposed intermediate portion 108b is less likely to be etched than the peripheral portion 108c. However, as shown in FIG. 8, the upper portion of the intermediate portion 108b is etched, which results in the hard mask pattern 108 having a pyramid shape with a narrow upper portion and a wider lower portion.

Generally, due to factors such as the relative positions among the gas introduction port 241 and the exhaust port 221 of the substrate processing apparatus 200 and the substrate 100 and the heating distribution of the heater 213, it is difficult to perform the substrate processing uniformly on the entire surface of the substrate 100. That is, it is difficult to obtain uniform concentration of the metal component in the peripheral portion 108c throughout the surface of the substrate 100. For example, as shown in FIG. 7, the metal component penetrating the neighboring hard mask patterns 108-1 and 108-2 may not be sufficient compared to the metal component penetrating the hard mask pattern 108-3, which results in different heights among the intermediate portion 108b-1, the intermediate portion 108b-2 and the intermediate portion 108b-3. When the etching process is continuously performed in this state, the resulting structure would have the hard mask patterns 108-1, 108-2 and 108-3 with different heights or the hard mask patterns 108-1, 108-2 and 108-3 having different widths w1, w2 and w3 (or different distances w4 between the pillars 106-1 and 106-2 and W5 between 106-2 and 106-3) as shown in FIG. 8. That is, the etching process is not uniformly performed throughout the surface of the substrate 100, which makes it difficult to obtain the semiconductor devices with uniform characteristics for the entire substrate 100.

In order to solve the above-described problem, a concentration profile adjusting step S208 is performed. In the concentration profile adjusting step S208, the metal concentration of the portion other than the center portion 108a is adjusted to be substantially the same as that of the center portion 108a such that the concentration profile of the hard mask pattern 108 is uniform throughout the entire substrate 100. Hereinafter, the concentration profile adjusting step S208 will be described in detail with reference to the flowchart shown in FIG. 6.

<Inert Gas Supply and Second Gas Storing Step S302>

The inert gas is supplied to the process chamber 201 by the inert gas supply system. The inert gas removes the metal component attached to the peripheral portion 108c. The removal of the metal component facilitates the infiltration of the metal component in the second infiltration step S304. The first gas is supplied to the flash tank 117 with the valve 118 closed while the inert gas is supplied. The first gas is stored in the flash tank 117 at a high pressure. By increasing the pressure of the first gas when stored, the first gas may be supplied into the process chamber 201 at a high pressure by opening the valve 118.

The inner pressure of the flash tank 117 is at the predetermined level that prevents the re-liquefaction of the first gas, which is a second pressure lower than the first pressure in the step S204. If the inner pressure of the flash tank 117 is at such a level that the first gas is re-liquefied, the metal component of the first gas solidifies, which makes it difficult to supply the metal component to the process chamber 201. The metal component in gaseous state may be smoothly supplied into the process chamber 201 by adjusting the inner pressure of the flash tank 117 to the predetermined level that prevents the re-liquefaction of the first gas as in the embodiment.

<Second Infiltration Step S304>

Next, a second infiltration step S304 for infiltrating the metal component into the hard mask pattern 108 will be described. In the second infiltration step S304, the metal-containing gas, which is the first gas (source gas), is supplied into the process chamber 201 by the first gas supply system. For example, the metal-containing gas includes TMA gas. Specifically, the valve 116 is opened and the metal-containing gas is supplied from the first gas supply source 113 to the flash tank 117 with the valve 118 closed. The first gas may be stored in the flash tank 117 at a high pressure with the valve 118 closed.

When the inner pressure of the flash tank 117 is at the predetermined level that prevents the re-liquefaction of the first gas and is also lower than the first pressure, the valve 118 is opened and the first gas is "flash-supplied" into the chamber 201. Since the first gas supplied is supplied at high pressure, the metal component of the first gas infiltrates into the intermediate portion 108b.

After the second infiltration step S304 is performed, a step S306 is performed. In the step S306, it is determined whether the steps S302 through S304 have been performed a predetermined number of times. That is, in the step S306, it is determined whether the cycle including the steps S302 through S304 has been performed the predetermined number of times. When it is determined that the cycle is performed the predetermined number of times ("YES" in FIG. 6), that is, when the metal concentrations in the center portion 108a, the intermediate portion 108b and the peripheral portion 108c are uniform, the concentration profile adjusting step S208 is complete. When it is determined that the cycle is performed less than the predetermined number of times ("NO" in FIG. 6), that is, when the metal concentration in the peripheral portion 108c is lower than that of the intermediate portion 108b, the inert gas supply and second gas storing step S302 is performed again.

<Modifying Step S210>

An oxygen component is supplied to the hard mask pattern 108 of the substrate 100 to oxidize (modify) the surface of the hard mask pattern 108 in modifying step S210. As a result, the metal component that has infiltrated the peripheral portion 108c is suppressed from separated from the hard mask pattern 108. The modifying step S210 is also referred to as "cap film forming process." The oxide film formed on the surface of the peripheral portion 108c is also referred to as "cap film."

Next, the reason for performing the modifying step S210 after performing the concentration profile adjusting step S208 will be described. If the oxidation process in the modifying step S210 is performed before the concentration profile adjusting step S208, the oxide film formed in the modifying step S210 acts as a cap, making it difficult to inject the metal component into the peripheral portion 108c. Therefore, it is preferable that the modifying step S210 is performed after the metal component infiltrates in the concentration profile adjusting step S208.

Further, an inert gas supply step may be further performed to supply an inert gas between the concentration profile adjusting step S208 and the modifying step S210. The metal component attached to the surface of the hard mask pattern 108 in the concentration profile adjusting step S208 may be removed by the inert gas supplied in the inert gas supply step. The inert gas supply step facilitates the bonding of modifying material (oxygen component) the surface of the hard mask pattern 108 in the modifying step S210, thereby further suppressing the separation of the metal component.

A flash tank 137, a valve 138 and a pressure sensor 139 may be further provided in the second gas supply system denoted by dashed lines in FIG. 3. The inert gas may be "flash-supplied" by the flash tank 137 and the valve 138 in the inert gas supply and second gas storing step S302. As a result, the metal component at the surface of the hard mask pattern 108 may be more reliably removed. Therefore, the metal component may penetrate more reliably in the subsequent second infiltration step S304.

While the embodiment is exemplified by way of a single wafer type substrate processing apparatus capable of processing one substrate in one process chamber, the above-described technique is not limited thereto. The above-described technique may be applied to a batch type substrate processing apparatus capable of processing multiple substrates arranged in horizontal direction or in vertical direction.

While the embodiment is exemplified by way of a hard mask used as a template for lithography, the above-described technique is not limited thereto. The above-described technique may also be applied to semiconductor wafers subjected to micro-patterning. For semiconductor wafers, the above-described techniques may be employed for the micro-patterning of hard masks or photoresists such as double patterning which is a semiconductor manufacturing method.

According to the technique described herein, the uniformity of device characteristics can be improved.

What is claimed is:

1. A method of processing a substrate, comprising:
    (a) loading a substrate having a patterned hard mask into a process chamber;
    (b) supplying a metal-containing gas at a first pressure into the process chamber; and
    (c) supplying an inert gas into the process chamber and storing the metal-containing gas at a second pressure lower than the first pressure after performing (b).

2. The method of claim 1, wherein a first gas supply system configured to supply the metal-containing gas and a second gas supply system configured to supply the inert gas are connected to the process chamber, and
    the metal-containing gas is supplied by the first gas supply system in (b) and the inert gas is supplied by the second gas supply system in (c).

3. The method of claim 2, further comprising: (d) supplying the metal-containing gas at the second pressure stored in (c) into the process chamber after performing (c).

4. The method of claim 3, further comprising: (e) performing a cycle comprising (c) and (d) a predetermined number of times.

5. The method of claim 3, further comprising: (f) modifying the patterned hard mask after performing (c).

6. The method of claim 3, wherein a temperature at a surface of the substrate is higher than a re-liquefying temperature of the metal-containing gas and lower than thermal decomposition temperature of the metal-containing gas.

7. The method of claim 2, further comprising: (f) modifying the patterned hard mask after performing (c).

8. The method of claim 7, wherein a temperature at a surface of the substrate is higher than a re-liquefying temperature of the metal-containing gas and lower than thermal decomposition temperature of the metal-containing gas.

9. The method of claim 2, wherein a temperature at a surface of the substrate is higher than a re-liquefying temperature of the metal-containing gas and lower than thermal decomposition temperature of the metal-containing gas.

10. The method of claim 2, wherein the second gas supply system comprises a flash tank, and the inert gas is flash-supplied from the flash tank.

11. The method of claim 1, further comprising: (d) supplying the metal-containing gas at the second pressure into the process chamber after performing (c).

12. The method of claim 11, further comprising: (e) performing a cycle comprising (c) and (d) a predetermined number of times.

13. The method of claim 12, further comprising: (f) modifying the patterned hard mask after performing (c).

14. The method of claim 13, wherein a temperature at a surface of the substrate is higher than a re-liquefying temperature of the metal-containing gas and lower than thermal decomposition temperature of the metal-containing gas.

15. The method of claim 12, wherein a temperature at a surface of the substrate is higher than a re-liquefying temperature of the metal-containing gas and lower than thermal decomposition temperature of the metal-containing gas.

16. The method of claim 11, further comprising: (f) modifying the patterned hard mask after performing (c).

17. The method of claim 16, wherein a temperature at a surface of the substrate is higher than a re-liquefying temperature of the metal-containing gas and lower than thermal decomposition temperature of the metal-containing gas.

18. The method of claim 1, further comprising: (f) modifying the patterned hard mask after performing (c).

19. The method of claim 18, wherein a temperature at a surface of the substrate is higher than a re-liquefying temperature of the metal-containing gas and lower than thermal decomposition temperature of the metal-containing gas.

* * * * *